(12) United States Patent
Wilcoxen et al.

(10) Patent No.: US 11,251,152 B2
(45) Date of Patent: Feb. 15, 2022

(54) THINNED SEMICONDUCTOR CHIP WITH EDGE SUPPORT

(71) Applicant: Diodes Incorporated, Plano, TX (US)

(72) Inventors: Duane Wilcoxen, Dallas, TX (US); Chiao-Shun Chuang, Zhubei (TW); Rain Liu, Chengdu (CN); Thomas Tsai, Hsinchu (TW); Will Zhang, Chengdu (CN)

(73) Assignee: DIODES INCORPORATED, Plano, TX (US)

( * ) Notice: Subject to any disclaimer, the term of this patent is extended or adjusted under 35 U.S.C. 154(b) by 89 days.

(21) Appl. No.: 16/816,321

(22) Filed: Mar. 12, 2020

(65) Prior Publication Data

US 2021/0288014 A1  Sep. 16, 2021

(51) Int. Cl.
*H01L 23/00* (2006.01)
*H01L 29/78* (2006.01)

(52) U.S. Cl.
CPC .............. *H01L 24/32* (2013.01); *H01L 24/83* (2013.01); *H01L 29/7802* (2013.01); *H01L 2924/01014* (2013.01); *H01L 2924/13091* (2013.01)

(58) Field of Classification Search
CPC ..... H01L 24/32; H01L 24/83; H01L 29/7802; H01L 23/49827; H01L 23/49838; H01L 23/49866; H01L 23/49811; H01L 21/486; H01L 21/4853; H01L 27/1485; H01L 27/1464; H01L 27/14843; H01L 29/42304; H01L 29/7371; H01L 24/02; H01L 29/41708; H01L 27/0823; H01L 29/0657; H01L 29/7803; H01L 29/7395; H01L 29/66333; H01L 29/868; H01L 29/41741; H01L 29/872; H04N 5/37213; H04N 5/335

USPC ........ 257/107, 342, 133, 334, 268, 521, 527, 257/622, 627, 502, 94, 101, 1, 3, 191, 96, 257/431; 438/424, 135, 301, 462, 268, 438/336, 405

See application file for complete search history.

(56) References Cited

U.S. PATENT DOCUMENTS

| | | | |
|---|---|---|---|
| 3,754,191 A * | 8/1973 | Acket | H01L 47/00 330/5 |
| 5,591,665 A * | 1/1997 | Bodensohn | H01L 21/764 257/521 |
| 6,583,558 B1 * | 6/2003 | Suyama | H01J 29/44 250/207 |
| 7,098,108 B1 | 8/2006 | Zeng | |
| 7,768,102 B2 | 8/2010 | Risaki | |
| 10,505,035 B2 | 12/2019 | Cooper, Jr. | |
| 2003/0215985 A1 * | 11/2003 | Kouno | H01L 21/78 438/135 |
| 2004/0212034 A1 * | 10/2004 | Mochizuki | H01L 29/42304 257/502 |
| 2005/0242369 A1 * | 11/2005 | Udrea | H01L 29/0657 257/107 |
| 2007/0018179 A1 * | 1/2007 | Kub | H01L 29/0657 257/94 |

(Continued)

*Primary Examiner* — Mouloucoulaye Inoussa
(74) *Attorney, Agent, or Firm* — Yingsheng Tung

(57) ABSTRACT

A semiconductor device with reduced device resistance is disclosed. The semiconductor device comprises a semiconductor chip in which the chip thickness at the center portion of the chip where the circuit elements are disposed is uniform and is different from the chip thickness near the chip sides distant from the circuit elements.

14 Claims, 6 Drawing Sheets

(56) References Cited

U.S. PATENT DOCUMENTS

| | | | |
|---|---|---|---|
| 2007/0284360 A1* | 12/2007 | Santoruvo | B01J 19/0093 219/439 |
| 2009/0108288 A1* | 4/2009 | Ozeki | H01L 25/16 257/133 |
| 2011/0024854 A1* | 2/2011 | Suzuki | H04N 5/37213 257/431 |
| 2017/0084527 A1* | 3/2017 | Seddon | H01L 21/78 |

* cited by examiner

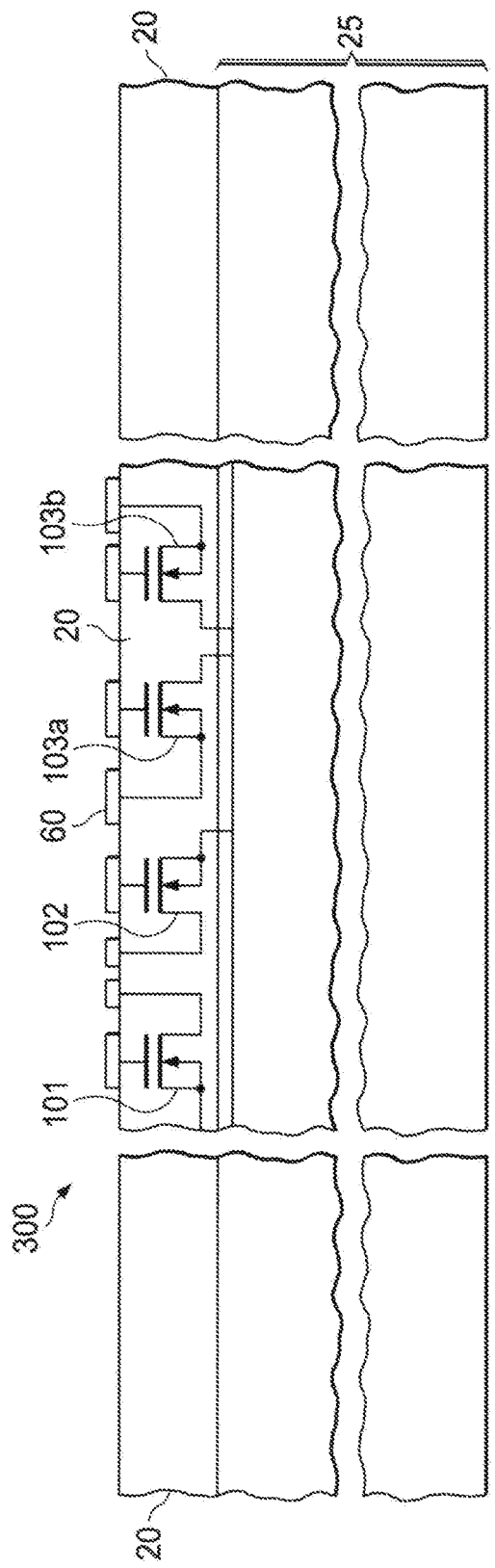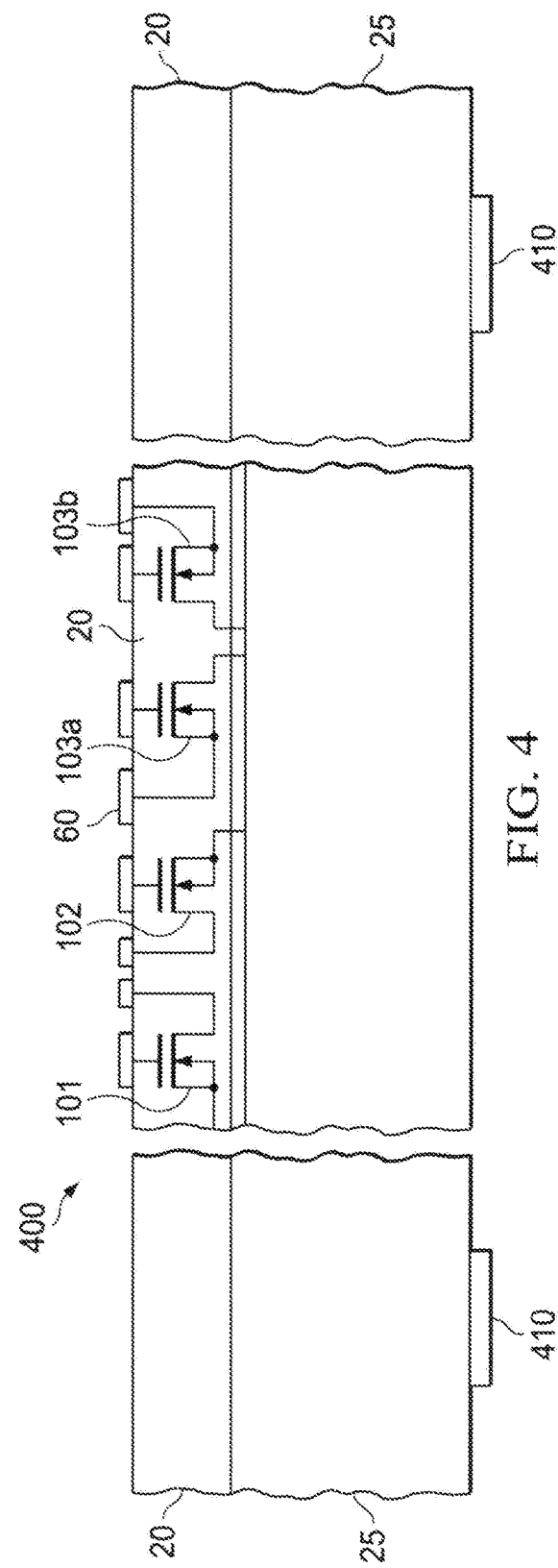

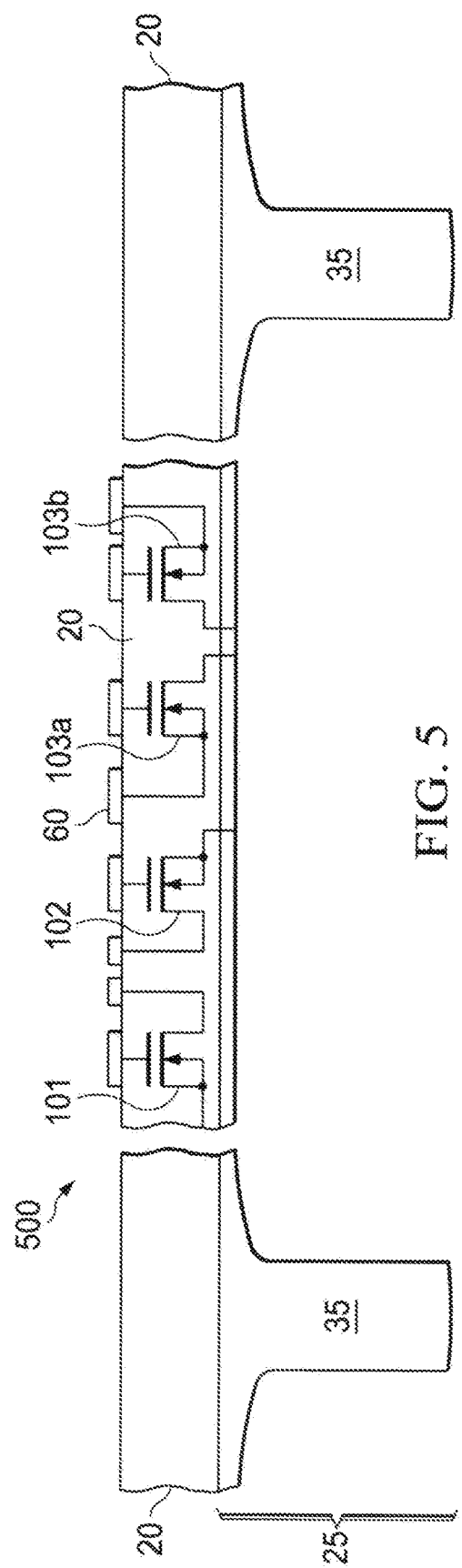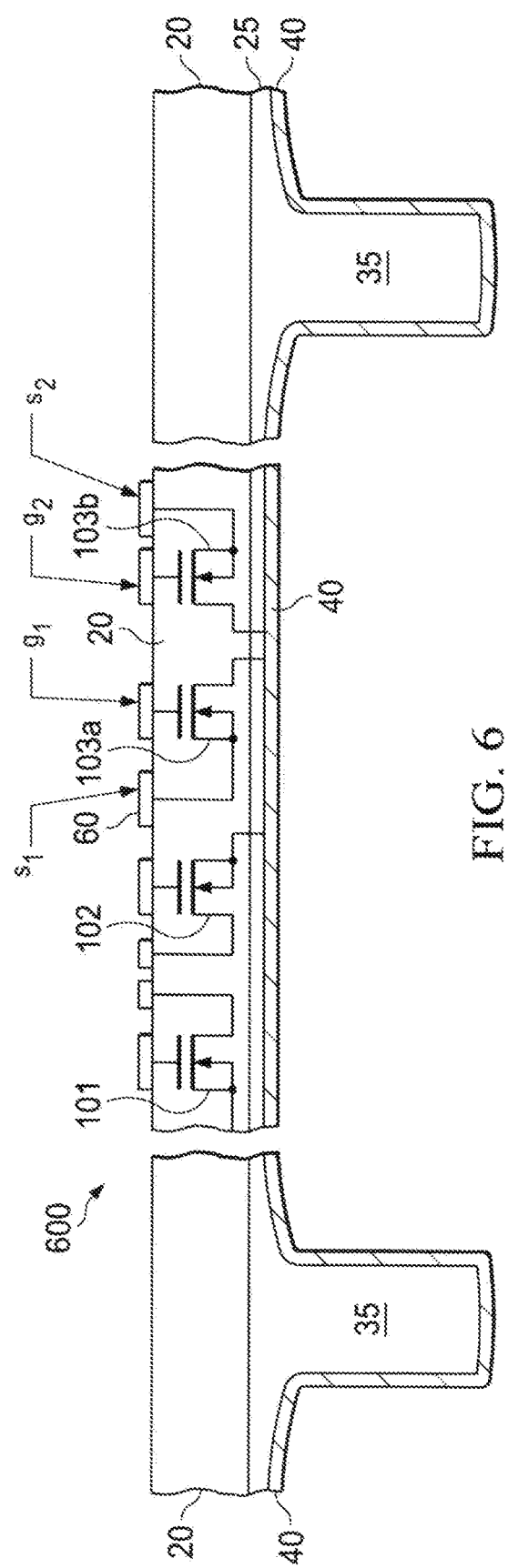

THINNED SEMICONDUCTOR CHIP WITH EDGE SUPPORT

BACKGROUND

Semiconductor devices are trending towards thin chips. One reason is the thinning of the final products such as cell phones and flat panel TVs. Also, thin chips perform better in at least two aspects: better heat dissipation and lower power consumption from the reduction of device resistance as the chips get thinner. Semiconductor materials such as silicon have finite electrical resistivity. Electricity flows through it converts power into heat instead of work and is generally undesirable.

One way to reduce device resistance is to build the device with thinner chips. Integrated circuits (ICs) are built in semiconductor wafers of a certain thickness for the physical support of the circuit elements in the wafers. After the front-end processes are complete, the wafer moves to the back-end processes commonly include a back grind step to reduce the wafer thickness before the individual chips are severed from the wafer and packaged. Currently the most advanced wafer thinning technique is the TAIKO thinning process, which is a modified back grind process that grinds the middle portion of the wafer and leaves a 3 mm edge around the wafer. In a manufacturing setting, the taiko thinning process can thin a semiconductor wafer down to about 50 µm; experimental reports have reported to have achieved 40 µm. The drawbacks of taiko thinning are the high cost of the equipment and the difficulty to handle the individual thin and fragile chips after they were severed from the wafer.

Other proposed methods to reduce chip resistance including the creation of recesses, vias, pits, cavities, and grid patterns of concave and convex portions on the back side of the wafers to be later filled with metallic or other conductive materials. It is hoped that by the selective excavation of the semiconductor material from the back side to reduce the mass of the wafer and thus proportionally reduces the total resistance. So far, this model has not been borne out in real products.

SUMMARY OF THE INVENTION

The Inventors of this invention have observed that, from their own experimental work, that even when a silicon wafer loses close to 20% of its backside area by excavating down to the depth of 100 µm to form various patterns of holes and intersecting trench grids, the device resistance does not drop appreciably. One possible reason is that the models fail to adequately consider the detrimental effect of the complex and uneven chip topography thus created on the current flow. The turbulence in current flow results in higher local current density and higher ohmic heat, and higher power loss. And, in high frequency switching applications, adding metal layer with thickness beyond the skin depth of the signals does not contribute appreciably to total resistance reduction.

The Inventors also observed that during normal operation, very little current flows outside the center portion of the chip where of the circuit elements are disposed, and the peripheral area outside the center portion of a chip contributes little to the total device resistance. Therefore, the Inventors endeavored to create a chip that is structurally thicker at the periphery of the chip for enhancing mechanical strength of the chip, and thinner and flat near the circuit elements for relatively unimpeded current flow. With the thin and flat portion over 60% of the chip area, a reduction in device resistance of over 50% has been achieved. Therefore, another aspect of this invention is that by placing a wall structure at the periphery of the chip so not to impede the current flow near the center portion in order to fully realize the chip resistance reduction.

This invention may be applied beneficially to many groups of semiconductor devices and ICs. In particular, trench MOSFETs can benefit because in trench MOSFET the major electrical current flow path traverses the thickness of the chip.

Another class of devices this invention can benefit including circuits in which trench MOSFETs are connected and where the current enters and exits the chip on the same chip surface, e.g. the top chip surface. One example is a circuit in which two trench MOSFETs are connected in series. In such devices, a back side metal layer connects the two MOSFETs so the current traverses the thin chip twice.

Even in the most traditional IC where current flow mostly in parallel to the top surface, a thin chip with a flat back side with back side metal layer will provide a favorable current path, especially with a back side metal layer, for reducing device resistance and power dissipation.

Another aspect of this invention is the process of encapsulating the semiconductor chips with a molding compound such as epoxy to further enhance the device package integrity. The encapsulation process starts with grinding the back side of a wafer to a suitable thickness after the wafer has completed the front-end process. Following the grinding, a photo-resist pattern depicting a wall structure that encloses the center portion of each die is applied to the back side of the wafer. The semiconductor material in the area inside the wall structure is then removed, for example, by plasma etching. Currently, the inventors can routinely etch silicon wafers where the center portions of the chips are about 25 µm from the front chip surface, thinner chips are also contemplated.

The thinned wafer is applied with a metal layer to its entire back side. The metal layer could be multi-layered such as sputtered titanium or titanium copper for "sticking layer" on bare silicon surface, plus plated thick copper layer to carry current. For some applications, this metal layer may be omitted.

After the application of the optional metal layer, the wafer is encapsulated with a molding compound material, which flows under heat, pressure, or both, to fill the tub shaped portions of the wafer backside, including the wall structure. The molding process reverts the wafer back to the pre-etch flatness to facilitate the subsequent processing, such as sawing, electrical testing and laser marking.

BRIEF DESCRIPTION OF DRAWING FIGURES

FIG. 3 depicts the wafer in FIG. 2 at a later stage of the process after the wafer is thinned by back side grinding.

FIG. 4 depicts the wafer in FIG. 3 at a later stage of the process with a photoresist pattern applied.

FIG. 5 depicts the wafer in FIG. 4 after a plasma etching process to form a wall structure.

FIG. 6 depicts the wafer in FIG. 5 at a later stage of the process after a back side metal layer. Is formed.

DEFINITIONS

Figure 1:
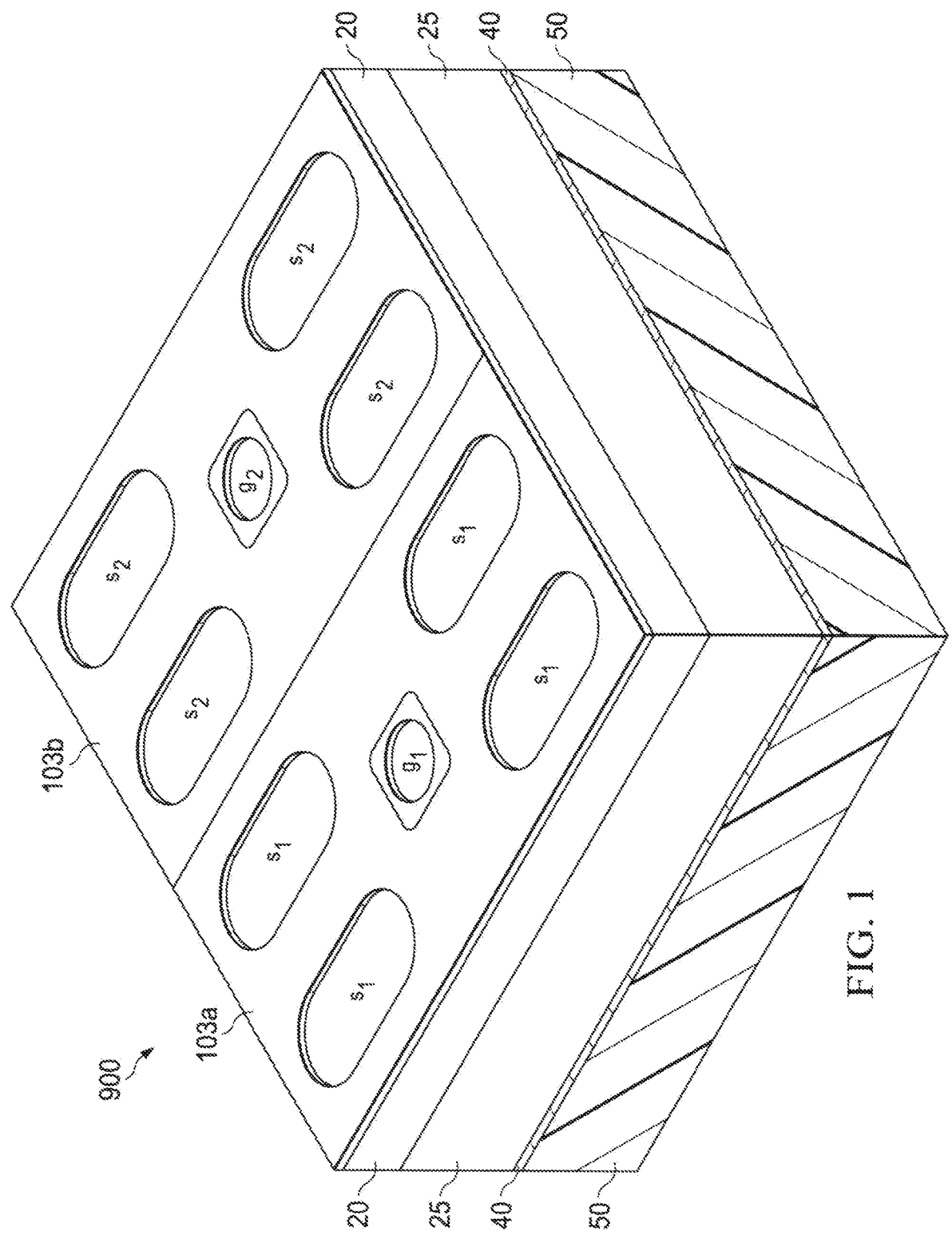
FIG. 1 depicts a perspective view of a chip that embodies certain aspects of this invention.

The terms used in this disclosure generally have their ordinary meanings in the art within the context of the invention. Certain terms are discussed below to provide additional guidance to the practitioners regarding the description of the invention. It will be appreciated that the same thing may be said in more than one way. Consequently, alternative language and synonyms may be used.

A semiconductor device in this paper refers to a device that contains semiconductor materials. The material may be a single element in group IV on the periodic table such as silicon, geranium, and carbon, and compounds such as gallium nitride and silicon carbide. The semiconductor material in semiconductor devices usually comes in the form of chips. The device may contain more than one chip in multi-chip packages. The chip or chips are usually encapsulated with protective material such as metal, ceramic, or epoxy.

A chip in this paper refers to a small piece of semiconductor material in which circuit elements are embedded. A chip is usually square and has two main opposite surfaces of major crystallographic planes. In this paper, the term chip is interchangeable used as the term die.

In this paper, terms such as top, bottom, and side as in top device surface, top chip surface, and chip sides are used in reference to the attached drawing figures and should not be construed as indication of orientation limitations when describing a physical device.

In this paper, the term center portion such as "in a center portion of the chip" means a general area in a chip distant from the edge of the chip. In conventional chip design layouts, circuit elements and the wirings between elements are arranged in the center portion because the mechanical sawing at the end of assembly process results in rupture of the semiconductor crystal structure and creates "crystallographic defects." The effects of such defects reach inwardly from the edges. In order to ensure the device operates as designed, circuit elements are kept away from the peripheral region of chips.

In this paper, the term "varied" refers to the value of measurements that change as a function of the location or time of the measurement, as opposed to being constant. The change may be gradual or it may be stepwise.

In the paper, terms such as orthogonal, linear, flat, and uniform are to be construed as descriptions of a manufactured article. To the extent that there are manufacturing and measurement tolerances the terms are not necessarily mathematical.

In this paper, circuit elements refer to electrical components such as p-n junctions, transistors, diodes, rectifiers, resistors, capacitors, and inductors, and conduction wirings, that can be coupled together to form electric circuits.

In this paper, the term device resistance refers to the measured electrical resistance of a circuit element when it is properly bias. For example, when a p-n junction diode is forward biased, the device resistance is the ratio of the voltage across the diode terminals to the current through the junction.

In this paper, the term front-end refers to the portion of manufacturing of semiconductor devices that starts at fresh wafers through the fabrication of circuit elements embedded in the wafers and traditionally ends with the application of a passivation layer on the wafers. The term back-end refers to the portion of manufacturing of semiconductor devices that starts at the completion of the front-end processes and traditionally includes steps such as back-grind, die-bond, wire-bond, molding, sawing, testing, and laser marking. The process disclosed in this paper include both front-end and back-end process steps.

In this paper the term wall structure refers to a structure that is disposed on the edge of a chip and is integral part of the chip for the purpose of enhancing the mechanical strength to the chip. The wall structure has an outer surface that meets the top surface of the chip and defined the outer edge of the chip. When the wall structure is formed by plasma etch, the intersection of the vertical portion of the wall and the bottom surface of the chip is curved as depicted in the drawing figures.

In this paper, the term enclosing refers to the placement of the wall structure around the edge of the chip so it surrounds the center portion of the chip. In some embodiment, the wall structure does not completely seal off the center portion of the chip and allows gaps in the wall sections.

In this paper the term near the top chip surface refers to the location of the circuit elements embedded in the semiconductor chip. Traditionally, circuit elements are installed in the chip at the front-end by introducing foreign material including selected impurity elements from the top chip surface into the interior of the chip and adding thin film on the top surface. As a result, the circuit elements are generally disposed near the top chip surface.

In this paper, the term height refers in general to the length of a structural element as measured from a reference point. For example, in the embodiments of this invention that include wall structure in a chip, the height of its outer surface is in reference to the top chip surface and the height of its inner surface is in reference to the bottom chip surface.

DETAILED DESCRIPTION OF EMBODIMENTS

FIG. 1 depicts a perspective view of a semiconductor device 900 that embodies certain aspects of this invention. In this embodiment, elements 20 and 25 are silicon, in which element 25 is a substrate layer, element 20 is an epitaxial layer grown on top of the substrate layer 25. The electrical resistivity of the epitaxial layer 20 is higher than the resistivity of the substrate 25. Layer 20 and layer 25 Layer combine to make up the semiconductor chip in the device 900. Layer 40 is a metal layer and is referred to as the back-side metal layer, which makes ohmic contact to the back side of the silicon chip. Layer 50 is a non-conductive layer, which in this embodiment comprises a molding compound, an epoxy material mixed with filler particles. Layer 50 has a flat and smooth back side suitable for laser marking.

The silicon chip in this embodiment contains a pair of trench MOSFET devices 103a and 103b. The drain nodes of the two MOSFETs are connected electrically at the back-side metal layer 40. The source nodes of the two MOSFETs 103a and 103b are accessible through the two sets of metal pads S1s and S2s. The gate nodes are accessible through the metal pads g1 and g2. Other device elements may also be built in the silicon chip to make up different integrated circuits.

In the embodiment depicted in FIG. 1, the edges of the silicon chip are exposed. In other embodiments, the edges may be further covered with protective material such as similar epoxy materials of layer 50. The process of the fabricating the semiconductor device will be described in more detail in the following paragraphs, in conjunction with the drawing figures.

Figure 2:
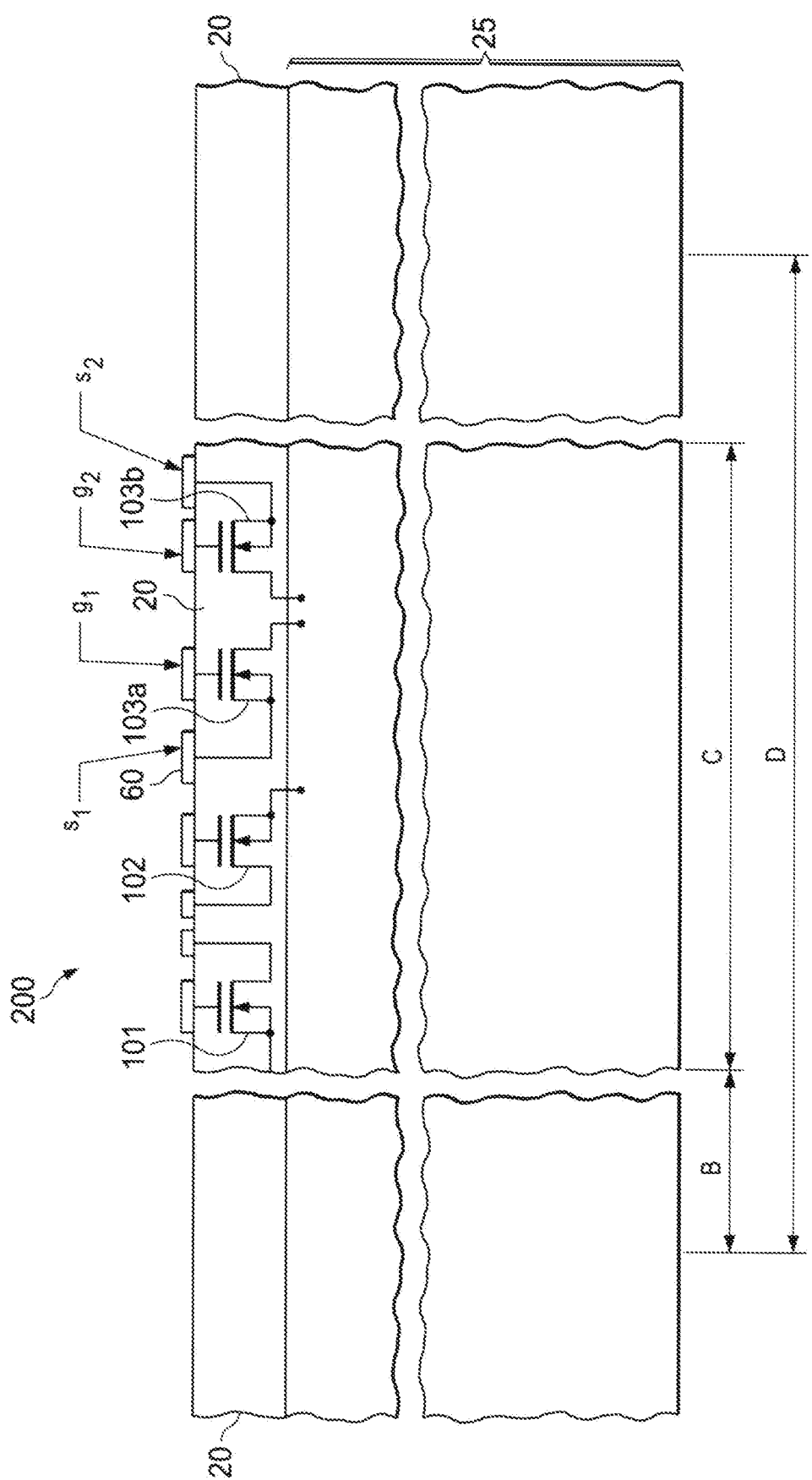
FIG. 2 depicts a cross section view of a wafer at the beginning of a process that embodies certain aspects of this invention.

FIG. 2 depicts a cross section view of a wafer 200 at a stage of the fabrication after the front-end process is complete. A section marked as D delineates a portion of the wafer that will be severed to be an individual chip at the end of the fabrication process. The middle of the chip D is a section marked as C for the center portion of the chip, and two sections marked as P for the periphery portions of the chip. The span of the portion C depends on the complexity of the circuits and the process technology nodes and may vary from a few mm's to several cm's. At this stage of the process, circuit elements embedded in the wafer have been fabricated. FIG. 2, for demonstrative purpose, includes four circuit elements 101, 102, 103*a*, and 103*b*. Chips in other embodiments of this invention may have as few as a single circuit element such as a p-n junction diode, or have over one billion transistors. In this embodiment, the circuit elements are all embedded in the epitaxial layer 20, which is less than about 10 μm thick. Other embodiments may have thinner or thicker epitaxial layers. The substrate layer 25, of which the thickness varies depending on the diameter of the wafer, is about 300 μm thick in this embodiment. The circuit elements 103*a* and 103*b* are two trench MOSFETs and are designed to be connected at their drain modes. The current path in a trench MOSFET is primarily perpendicular to the thickness of the chip, and the method of fabricating trench MOSFET in silicon is general known in the art. The circuit element 102 is a vertical MOSFET in which the source node is connected to the back of the chip where a metal layer will be disposed later. Circuit element 101 is a "surface device" such as a rectifier, and all its terminal nodes are accessible from the top surface of the device and the current path in the device is mainly parallel to the chip surface.

FIG. 3 depicts the wafer in FIG. 2 after it is thinned down with a mechanical grinding step known in the art. In this embodiment the substrate layer 25 is thinned to about 150 μm from its original thickness of about 300 μm. The starting and final thicknesses are only for demonstrative purpose and in other embodiments they may differ.

FIG. 4 depicts the wafer in FIG. 3 after a photoresist pattern 410 is applied to the back side of the wafer. The photoresist pattern delineates the wall structures that enclose the center portion C in each chip. In this embodiment, the photoresist pattern comprises orthogonal and linear grid lines of about 300 μm wide. In other embodiment, the pattern may vary to comprise structures in the center portion of the chip to add mechanical strength to the chip.

FIG. 5 depicts the wafer in FIG. 4 after the silicon goes through a plasma etch process. With this process, the center portion of the chip is excavated to create a thin and flat center portion enclosed by a wall structure 35 at the peripheral portion. In this embodiment, the etching agent is a chemical in its plasm state that reacts with the wafer in a sealed chamber of controlled pressure and temperature. The final thickness of the silicon at the flat portion of the chip, in this embodiment, is about 25 μm, which includes the epitaxial layer 20 in its original thickness and a portion of the substrate layer 35. The process is similar to the silicon via etching process known in the art of silicon process. After the plasma etch, the photoresist pattern 410 is removed with an oxidation agent.

As depicted in FIG. 5, the wall structure in this embodiment has a column shaped lower portion and a spread-out portion towards the center portion of the chip, the spread-out portion has a varied thickness greater than the chip thickness at near the center portion of the chip.

FIG. 6 depicts the wafer in FIG. 5 after a metal layer 40 is applied to the structured back side of the silicon chip. The method of application is generally known in the art of wafer processing. It may comprise sputtering and plating. The metal layer 40 may comprise multi-layers of different metals of different thicknesses for different purposes. For example, a thin layer of sputtered titanium is suitable as a "sticking" layer for the enhancement of adhesion between the silicon chip surface and the metals. Other metals such as aluminum and copper doped aluminum may be applied over the sticking titanium layer. The metal layer 40 covers the flat portion C of the chip and the side surfaces and the bottom of feet of the wall structure 35.

Figure 7:
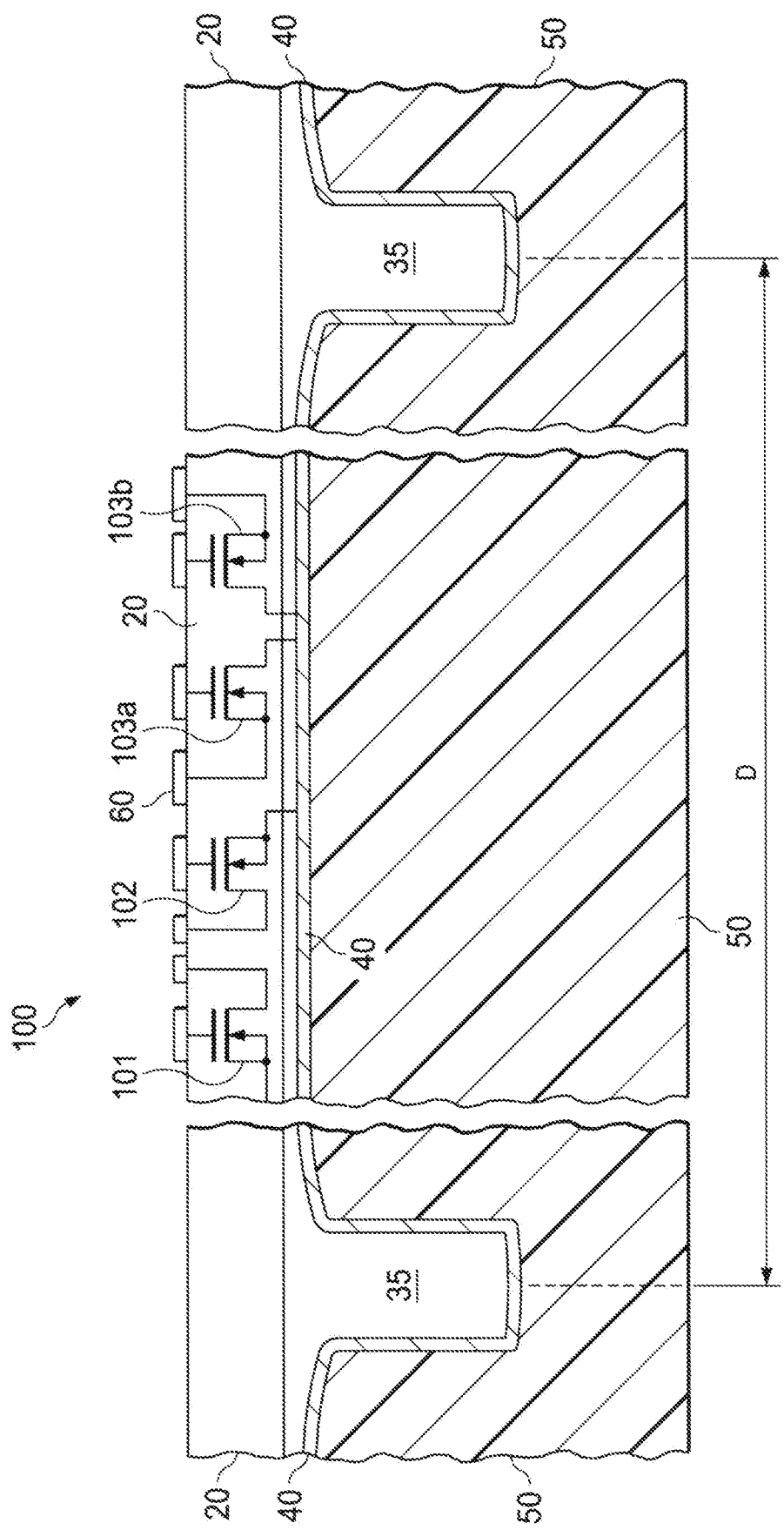
FIG. 7 depicts the wafer in FIG. 6 at a later stage of the process with a molding compound layer filling the back side of the wafer and provides a smooth and flat surface.

FIG. 7 depicts the wafer in FIG. 6 after a molding compound 50 is applied to the back side of the wafer. The molding compound is applied in the form of a high viscous liquid, which flows under high temperature and pressure.

Figure 8:
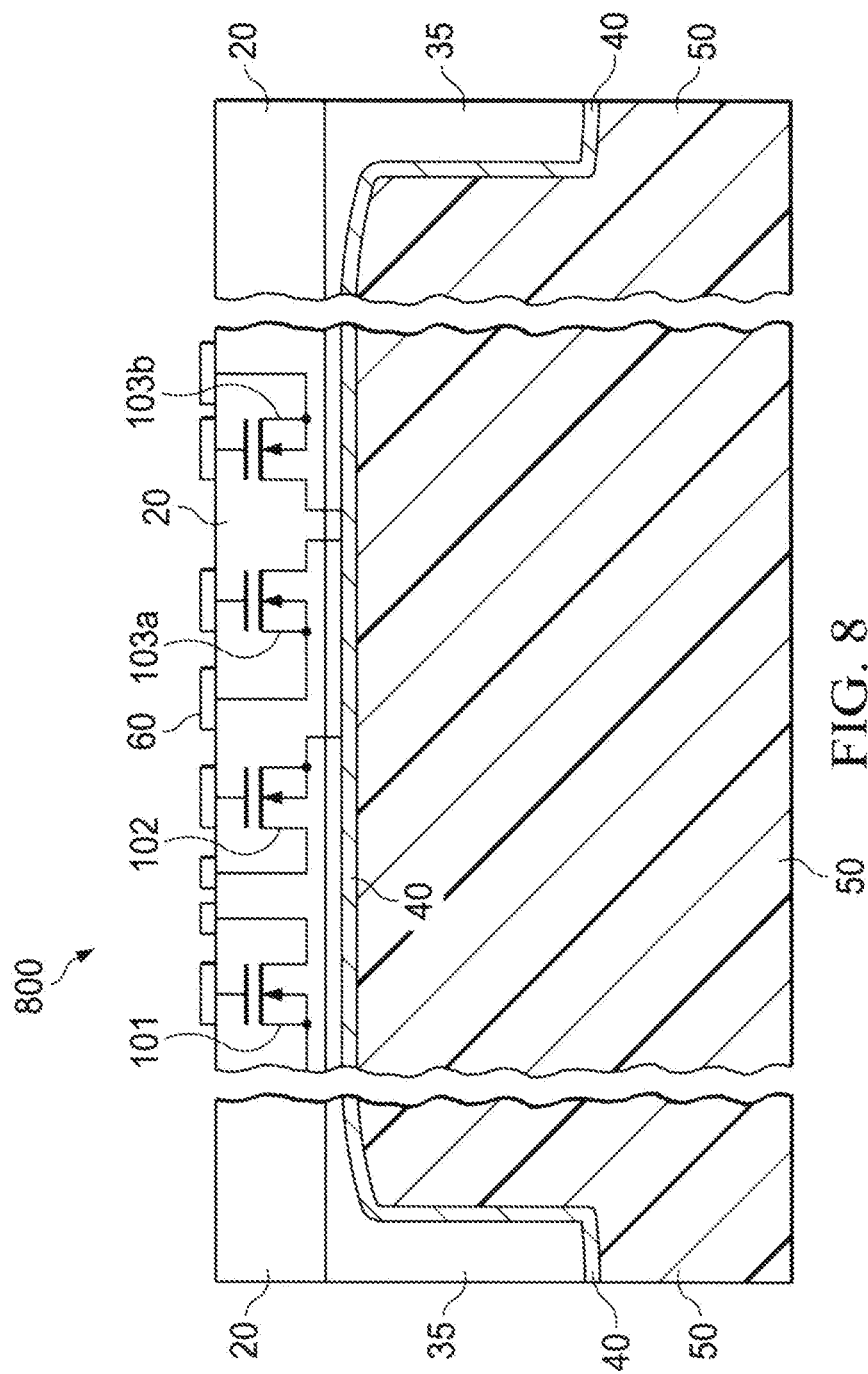
FIG. 8 depicts a semiconductor device in FIG. 7 after it is severed by sawing from the wafer along the middle of the wall structure.

FIG. 8 depicts a semiconductor device 800 after it is severed by sawing from the wafer along the middle of the wall structure 35. As severed, the outer surface of the wall structure is not covered by the metal layer 40. A perspective view of the semiconductor device is depicted in FIG. 1. The back surface of the molding compound is flat and smooth so the surface is suitable for laser marking at a later stage of the device manufacturing.

We claim:

1. A semiconductor device, comprising:
   a semiconductor chip having a top chip surface, a bottom chip surface, and chip sides;
   a first semiconductor layer having a first resistivity and a substrate under the first semiconductor layer, the substrate having a second resistivity lower than the first resistivity;
   circuit elements disposed in the first semiconductor layer in a center portion of the chip near the top chip surface;
   a structure in the substrate layer, the structure having an uniform first thickness at the center portion of the chip near the circuit elements and a varied second thickness different form the first thickness near the chip sides distant from the circuit elements; and
   a layer of molding compound having a flat back surface covering the uniform first thickness at the center portion of the chip near the circuit elements.

2. The semiconductor device of claim 1, further comprising:
   a linear wall structure disposed along the chip sides, enclosing the center portion of the chip;
   the wall structure having an outer surface extending from the top chip surface towards the bottom device surface, and a spread-out portion towards the center portion of the chip; and
   the spread-out portion having a varied thickness.

3. The semiconductor device of claim 2, further comprising a metal layer disposed between the molding compound layer and the bottom chip surface.

4. The semiconductor device of claim 2, in which the bottom chip surface being concave near the wall structure.

5. The semiconductor device of claim 3, in which the outer surface of the wall structure is not covered by a metal layer.

6. The semiconductor device of claim 2, in which the first semiconductor layer is a semiconductor epitaxial layer with the first resistivity.

7. The semiconductor device of claim 6, in which the semiconductor substrate layer is under the epitaxial layer and has the second resistivity lower than the first resistivity.

8. The semiconductor device of claim 1, in which the circuit elements comprises a rectifier.

9. The semiconductor device of claim 8, in which the rectifier comprises two terminals accessible from the top chip surface.

10. The semiconductor device of claim 1, in which the circuit elements comprises a MOSFET.

11. The semiconductor device of claim 10, in which the MOSFET comprises two terminals accessible from the top chip surface.

12. The semiconductor device of claim 1, in which the circuit elements comprises two MOSFETs.

13. The semiconductor device of claim 12, in which the two MOSFETs comprise four terminals accessible from the top chip surface and two terminals connected by a backside metal layer at the back, chip surface.

14. The semiconductor device of claim 7, in which the wall structure comprises a section of epitaxial layer and a section of substrate layer.

\* \* \* \* \*